United States Patent [19]

Lawton

[11] Patent Number: 5,469,118
[45] Date of Patent: Nov. 21, 1995

[54] INTEGRATED OSCILLATOR CIRCUITS

[75] Inventor: Rodney J. Lawton, Swindon, United Kingdom

[73] Assignee: Plessey Semiconductors Limited, United Kingdom

[21] Appl. No.: 343,708

[22] Filed: Nov. 22, 1994

[30] Foreign Application Priority Data

Nov. 24, 1993 [GB] United Kingdom ............... 9324155

[51] Int. Cl.⁶ .................... H03B 27/00; H03K 3/283
[52] U.S. Cl. .............. 331/113 R; 331/45; 331/177 R
[58] Field of Search ............... 331/34, 45, 111, 331/113 R, 108 C, 143, 144, 177 R; 327/101, 129, 182, 238, 254, 255, 295

[56] References Cited

U.S. PATENT DOCUMENTS

| 3,142,023 | 7/1964 | Tillman | 331/45 |
| 3,559,096 | 1/1971 | Lokerson | 331/113 R |
| 3,563,247 | 2/1971 | Bowers | 331/113 R |
| 3,585,526 | 6/1971 | Zelinka | 331/113 R |
| 3,899,753 | 8/1975 | Malaviya | 331/113 R X |
| 4,025,877 | 5/1977 | Hara et al. | 331/113 R |

FOREIGN PATENT DOCUMENTS

| 1333654 | 9/1962 | France | 331/113 R |
| 0464087 | 6/1968 | Switzerland | 331/113 R |
| 0649130 | 2/1979 | U.S.S.R. | 331/113 R |
| 1213939 | 11/1970 | United Kingdom | 331/113 R |

OTHER PUBLICATIONS

Hopkins, J. C. "Efficient Square Wave Oscillator" *Wireless World*, Jun., 1977, p. 58, Cl 331–113R, vol. 83, No. 1498.
Figure 5. of *Electronic Designs* p. 67, Apr. 11, 1968.
Thornwall, J. C., "Design Noise Out Of Spacecraft Payloads" pp. 64–68.

Primary Examiner—Davis Mis
Attorney, Agent, or Firm—Kirschstein, et al.

[57] ABSTRACT

A stable sine wave oscillator circuit comprising two pairs of cross-coupled bipolar transistors in cascode, the collector electrodes of the transistors of each pair being interconnected by way of respective capacitors. Output signals in phase quadrature may be obtained from across these two capacitors.

6 Claims, 2 Drawing Sheets

INTEGRATED OSCILLATOR CIRCUITS

BACKGROUND OF THE INVENTION

The present invention relates to oscillator circuits suitable for inclusion in integrated circuits. In particular the invention is concerned with oscillator circuits for providing stable sine-wave outputs.

SUMMARY OF THE INVENTION

According to the present invention a stable sine-wave oscillator circuit comprises first and second bipolar transistors having their emitter/collector paths connected in series with first load means between a first supply voltage conductor and one terminal of a current source the other terminal of which is connected to a second supply voltage conductor, third and fourth bipolar transistors having their emitter/collector paths connected in series with second load means between said first supply voltage conductor and said one terminal of said current source, a first capacitor connected between the collector electrodes of said second and fourth transistors and a second capacitor connected between the collector electrodes of said first and third transistors, the base and collector electrodes of said second and fourth transistors being cross-connected and the base and collector electrodes of said first and third transistors being cross-connected.

The first and second load means may comprise respective load resistors or respective diodes, or may comprise emitter/collector paths of further bipolar transistors in series with respective load resistors, the base electrodes of said further transistors being connected to said first supply voltage conductor.

BRIEF DESCRIPTION OF THE DRAWING

Oscillator circuits in accordance with the present invention will now be described with reference to the accompanying drawings, of which.

DETAILED DESCRIPTION OF THE PREFERRED EMBODIMENT

Figure 1:
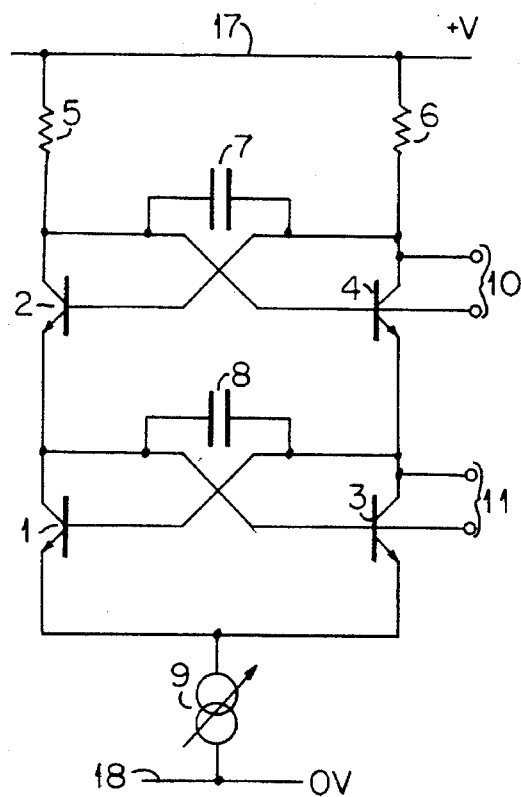
FIGS. 1 to 3 show diagrammatically respective different embodiments of the invention.

Referring first to FIG. 1 the basic oscillator circuit in accordance with the present invention comprises four bipolar npn junction transistors 1 to 4 which are connected in two cross-connected cascoded pairs. The emitter/collector paths of transistors 1 and 2 are connected in series with a load resistor 5 between a supply conductor 17 and one terminal of a current source 9 the other terminal of which is connected to a supply conductor 18. The emitter/collector paths of transistors 3 and 4 are connected in series with a load resistor 6 between the supply conductor 17 and the one terminal of the current source 9.

The collector electrodes of the transistors 2 and 4 are interconnected by way of a capacitor 7, and the base and collector electrodes of these transistors are cross-connected. Likewise the collector electrodes of the transistors 1 and 3 are interconnected by way of a capacitor 8 and the base and collector electrodes of these transistors are cross-connected. Differential outputs 10 and 11 are taken from the collector electrodes of the transistors 2 and 4 and 1 and 3 respectively.

By virtue of the charging and discharging currents flowing in operation to the capacitors 7 and 8 the oscillatory signals at the outputs 10 and 11 are in phase quadrature. The circuit oscillates at a frequency which is proportional to the value of current provided by the current source 9 and which is inversely proportional to the values of the capacitors 7 and 8.

Figure 2:
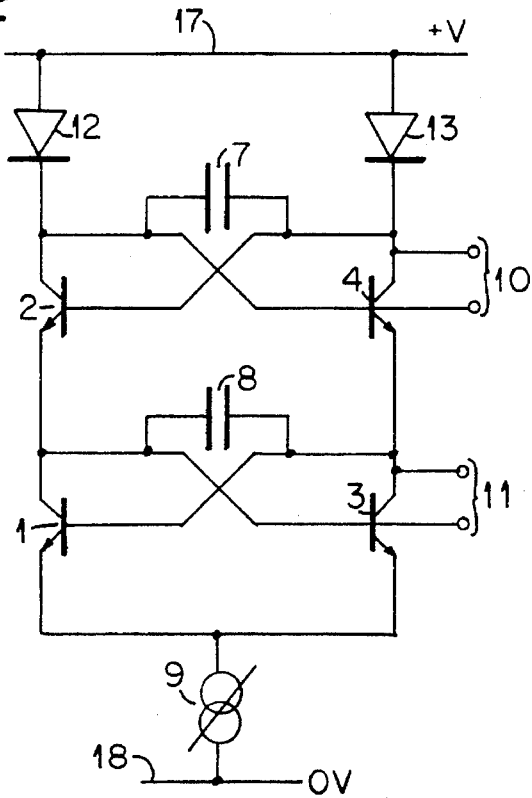
Figure 3:
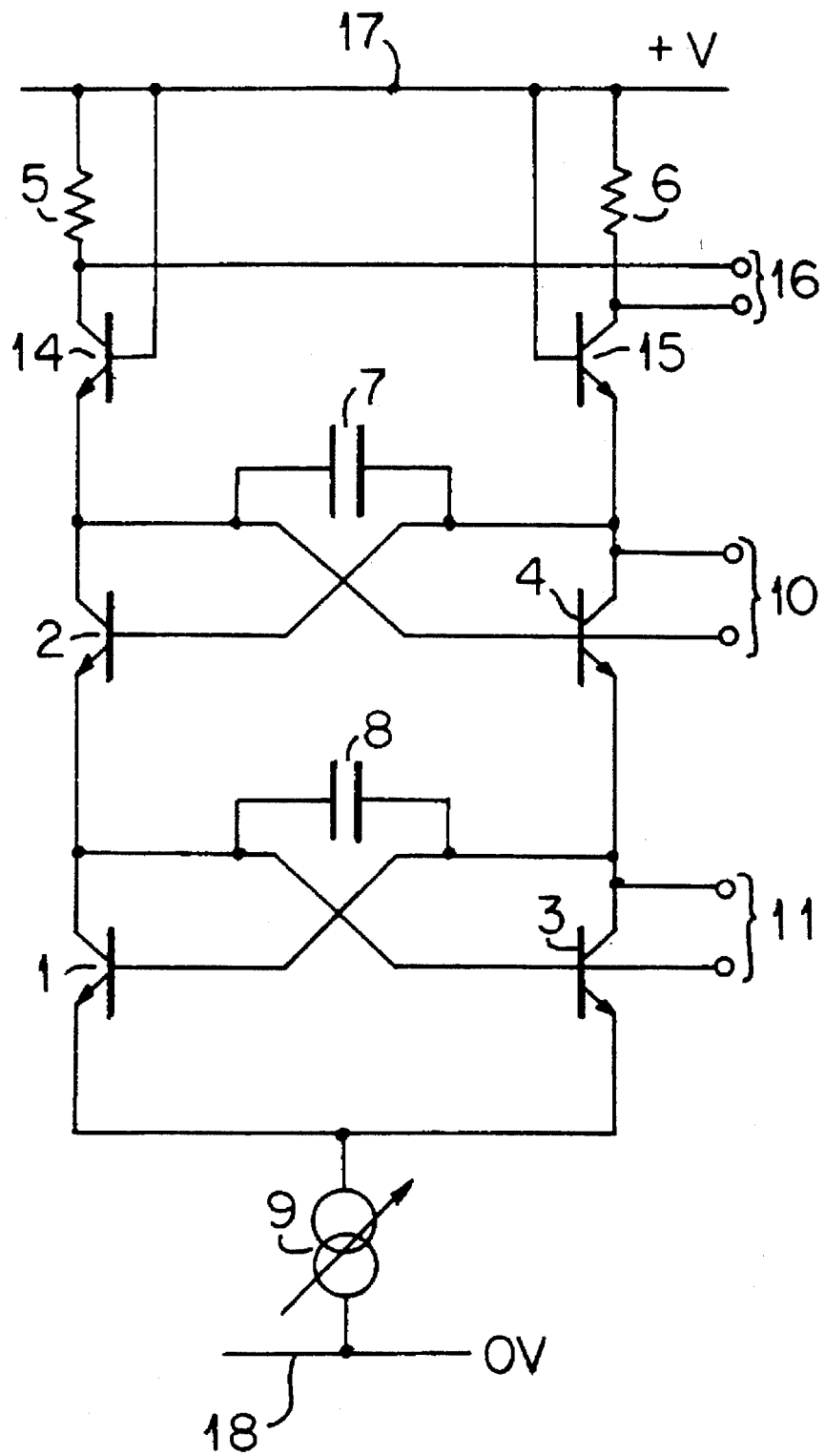

The load resistors 5 and 6 may be replaced by diodes 12 and 13 as shown in FIG. 2, or diode-connected transistors 14 and 15 respectively may be connected between the collector electrodes of the transistors 2 and 4 and the load resistors 5 and 6, as shown in FIG. 3. In the latter arrangement a third output 16 may be taken between the collector electrodes of the transistors 14 and 15, signals at this third output being in phase with signals at the output 10.

The circuit is capable of a very wide tuning range, by adjusting the current value provided by the current source 9, and is ideally suited to performing the local oscillator function in superheterodyne, homodyne and image cancelling radio receivers. Of particular advantage is the use of a single current source, resulting in minimum power consumption.

I claim:

1. A stable sine-wave oscillator circuit comprising first and second bipolar transistors having their emitter/collector paths connected in series with first load means between a first supply voltage conductor and one terminal of a current source the other terminal of which is connected to a second supply voltage conductor, third and fourth bipolar transistors having their emitter/collector paths connected in series with second load means between said first supply voltage conductor and said one terminal of said current source, a first capacitor connected between the collector electrodes of said second and fourth transistors and a second capacitor connected between the collector electrodes of said first and third transistors, the base and collector electrodes of said second and fourth transistors being cross-connected and the base and collector electrodes of said first and third transistors being cross-connected.

2. An oscillator circuit in accordance with claim 1 wherein said first and second load means comprise respective load resistors.

3. An oscillator circuit in accordance with claim 1 wherein said first and second load means comprise respective diodes.

4. An oscillator circuit in accordance with claim 1 wherein said first and second load means comprise respective emitter/collector paths of respective further bipolar transistors in series with respective load resistors, the base electrodes of said further transistors being connected to said first supply voltage conductor.

5. An oscillator circuit in accordance with claim 4 wherein the collector electrodes of the second and fourth transistors are connected to a first pair of output terminals and the collector electrodes of the first and third transistors are connected to a second pair of output terminals.

6. An oscillator circuit in accordance with claim 5 wherein the collector electrodes of said further transistors are connected to a third pair of output terminals.

* * * * *